March 7, 1967 D. F. HILBIBER 3,308,271

CONSTANT TEMPERATURE ENVIRONMENT FOR SEMICONDUCTOR CIRCUIT ELEMENTS

Filed June 8, 1964

DAVID F. HILBIBER
*INVENTOR*

BY Roger S. Borovoy
ATTORNEY

United States Patent Office 3,308,271

Patented Mar. 7, 1967

3,308,271

CONSTANT TEMPERATURE ENVIRONMENT FOR SEMICONDUCTOR CIRCUIT ELEMENTS

David F. Hilbiber, Los Altos, Calif., assignor to Fairchild Camera and Instrument Corporation, Syosset, N.Y., a corporation of Delaware Filed June 8, 1964, Ser. No. 373,375
12 Claims. (Cl. 219—501)

Figure 1:
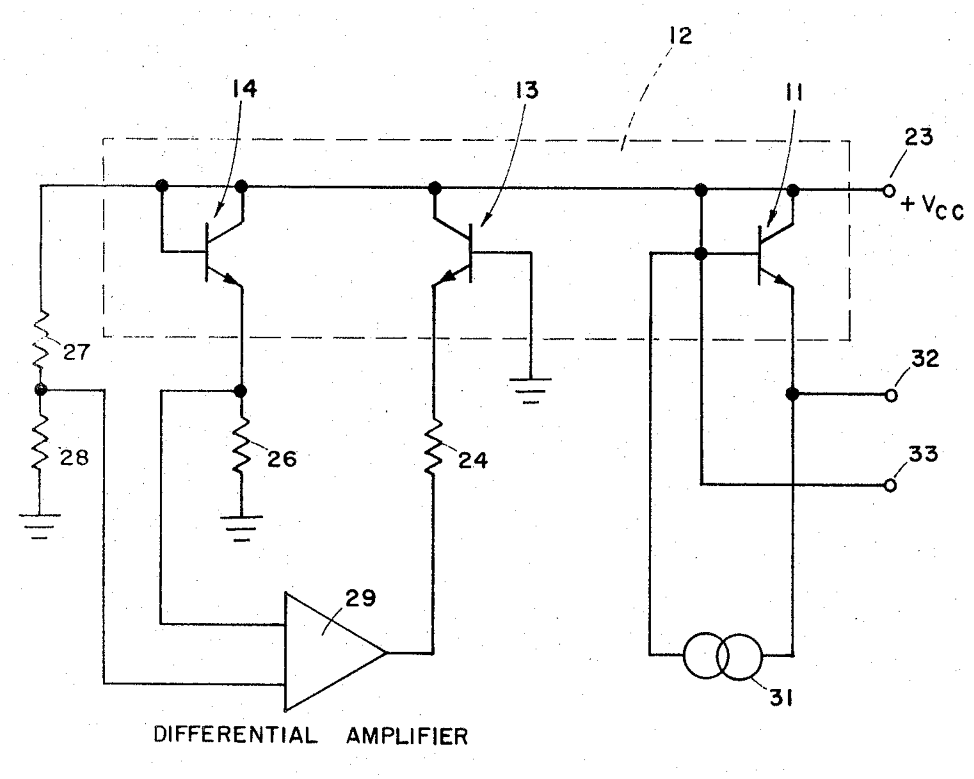

The present invention relates to arrangements for maintaining the junctions of one or more semiconductor circuit elements at a constant temperature so as to substantially eliminate the effects of temperature variations upon the operating characteristics of the circuit elements. More particularly, the invention is directed to a constant temperature environment arrangement wherein thermal feedback between various of a number of semiconductor devices in good thermal contact with a common substrate is employed to maintain a substantially constant substrate temperature and therefore a substantially constant temperature at various of the semiconductor devices which may be connected in external circuits.

The temperature dependence of the operating characteristics of transistors and other semiconductor devices is well known. In many circuit applications, the variation of the electrical characteristics of a semiconductor device with respect to temperature is not sufficiently detrimental to the operation of the circuit so that the temperature dependence need be considered under normal operating conditions. However, in other applications, such as in the field of instrumentation or computation using analog techniques, the accuracy of certain circuits employing semiconductor devices as circuit elements is seriously impaired by even a small order variation in temperature. For example, in semiconductor differential amplifier circuits, the output difference signal for a given pair of constant input signals varies significantly with respect to variations in the junction temperatures of the semiconductor circuit elements. Similarly, variations of the electrical characteristics of a semiconductor diode with temperature are such that where the diode is employed to generate a reference signal, the signal is not at all times accurately representative of the intended reference quantity. Likewise, the temperature dependence of a semiconductor device, as employed in an oscillator circuit or the like, effects a significant variation in the operating frequency and cannot be tolerated in constant frequency applications. Additionally, there exists the problem of adequately limiting temperature effects to obtain an accurate logarithmic transfer function of an electrical input signal where semiconductor devices are employed. In one prior art approach, logarithmic conversion has entailed the use of the forward biased characteristics of a PN junction diode, since the junction voltage is a logarithmic function of the junction current. However, the accuracy possible in such a circuit is limited by the junction voltage also being dependent upon temperature, which in turn varies as a function of the junction current. Accordingly, the logarithmic transfer function is not constant over a wide range of input current since the junction temperature correspondingly varies.

It is, therefore, among the objects of the present invention to provide a constant temperature environment for a semiconductor circuit element employed as a logarithmic converter, reference diode, or similar element; to provide an arrangement of constant temperature semiconductor circuit elements which, when employed in various circuits, do not detriment the circuit operation as a result of their inherent temperature dependence; to provide an extremely simple and rugged arrangement for establishing a constant temperature environment for semiconductor devices which does not require a bulky and unwieldy constant temperature capsule; and to provide a constant temperature arrangement wherein the heat dissipating capabilities and temperature sensing capabilities of semiconductor devices are employed to establish thermal feedback in a substrate common to a number of semiconductor devices in a manner to maintain the substrate temperature, and therefore the temperature of various of the semiconductor devices which may be employed as circuit elements, at a constant value.

In the accomplishment of the foregoing, and other objects and advantages, the present invention generally comprises a plurality of semiconductor devices in good thermal contact with a common substrate. At least one of the semiconductor devices is to be employed as a circuit element, such as a logarithmic converter of the type described hereinbefore, and is, therefore, to be maintained at a constant temperature. At least one other of the semiconductor devices is employed as a heating element in the substrate operating in accordance with current flowing through the device, and a further one of the semiconductor devices is employed as a heat sensor for producing a control signal in proportion to the temperature of the substrate. The temperature sensor semiconducting device is coupled to each of the heater semiconductor devices to control current therethrough in accordance with the control signal in such a manner as to maintain a constant temperature in the substrate and therefore in the vicinity of each of the semiconductor devices employed as circuit elements. More particularly, in response to an increase of substrate temperature, the control signal generated by the temperature sensor semiconducting device is effective to decrease the current through each of the heating semiconductor devices and thereby decrease the amount of heat dissipated in the substrate. Conversely, in response to a decrease in substrate temperature, the temperature sensor semiconducting device generates a control signal which is effective in increasing the current through each of the heater semiconducting devices to thereby increase the heat dissipated in the substrate and thus raise the substrate temperature. As a result, substrate temperature is continuously regulated to a constant value by virtue of the thermal feedback between the respective semiconductor devices associated with the substrate.

The foregoing general principle of the present invention is, of course, applicable to a variety of arrangements of semiconductor devices having a common substrate. For example, the substrate may be of semiconducting material such as silicon and the semiconductor devices may be of the diffused junction planar type, all contained in the same semiconducting substrate which functions as a common integral element. Alternatively, the substrate may be a single monolithic structure in which the semiconductor devices are commonly contained in electrically isolated relationship, while yet being in good thermally conducting relation to each other. As a further alternative, the substrate may be a common ceramic host substrate of aluminum oxide, or the like, upon which a number of separate semiconductor devices are mounted in good thermal contact.

Figure 2:
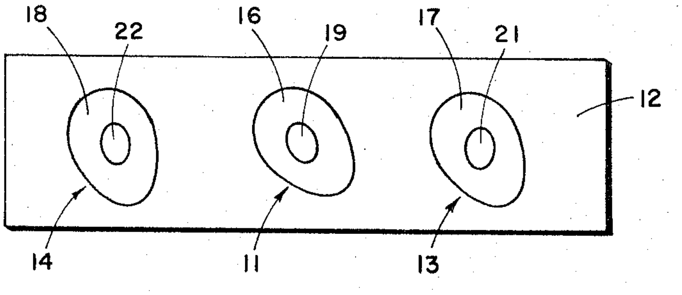

The invention will be better understood upon consideration of the following description taken in conjunction with the accompanying drawings wherein:

FIG. 1 is a schematic wiring diagram of an exemplary arrangement of semiconductor devices for maintaining a constant temperature environment for one semiconductor device employed in the illustrated case as a logarithmic conversion circuit element; and FIG. 2 is a plan view depicting the physical arrangement of the semiconductor devices of the circuit of FIG. 1.

The present invention is illustrated in the drawing and described in particular detail hereinafter with respect to the provision of a constant temperature environment for a transistor diode which functions as a logarithmic conversion circuit element. It is to be noted at the outset, however, that the principles of the invention likewise apply in circumstances where the transistor is employed for other purposes and where a diode or semiconductor device other than a transistor, or a plurality thereof, are employed as circuit elements which must be maintained at constant temperature in order that the temperature dependence of their operating characteristics is not a detriment to the operation of the circuit in which they are employed.

Referring now to the drawing in detail, the semiconductor device which is to be maintained at constant temperature and is to function as an element of a circuit is designated at 11, and as noted previously in the present case, is a transistor connected as a diode for providing a logarithmic conversion transfer function. Irrespective of the particular function to be served by the semiconductor circuit element 11, this element is in good thermal contact with a substrate as indicated at 12. At least one transistor 13, or other semiconductor device to be employed for heating purposes, and a transistor 14, or other semiconductor device to be employed as a temperature sensor, are likewise provided in good thermal contact with the same substrate 12. In the present case, as will be apparent from FIG. 2, the substrate 12 is of semiconducting material such as silicon and the transistors 11, 13, and 14 respectively have diffused base regions 16, 17, and 18 of opposite polarity to the common substrate 12 formed therein. Likewise, emitter regions 19, 21, and 22 of opposite polarity are diffused into the respective base regions. The transistors are located in close proximity to each other in the substrate and, hence, are in good thermal contact with each other. The circuit connections between the transistors, as illustrated in FIG. 1 and described hereinafter, are omitted from FIG. 2, and it is to be understood that the connections may be physically accomplished by various techniques well known in the art.

As is well known, transistors dissipate heat in a direct relation to the flow of current therethrough, and inasmuch as the transistor 13 is to function as a heater, that transistor is preferably arranged to dissipate a relatively large quantity of heat in the substrate in a variable manner determined by the current flow through it. The heater transistor 13 is accordingly advantageously selected or designed to have a relatively high power and current carrying capacity. In addition, the heater transistor is preferably connected to provide avalanche breakdown under the control of a reverse bias of the emitter-base junction thereof. More particularly, the collector of transistor 13, in the present case the common collector defined by the substrate 12, is energized by a bias voltage, as indicated at 23. The base 17 is connected to ground, while the emitter 21 is connected to a bias resistor 24 which is connected in a manner subsequently described to receive a current which is controlled by the temperature sensor transistor 14. This current flowing through the resistor 24 is sufficient to reverse bias the emitter-base junction of transistor 13 to the extent that avalanche breakdown occurs and a substantial quantity of heat is thereby dissipated in the substrate 12 in a direct relation to this current. In the event one heater transistor 13 generates insufficient heat to maintain a given substrate temperature, one or more additional transistors and associated bias resistors may be employed in parallel.

Temperature sensor transistor 14 uses to advantage the normally undesirable temperature dependence of the electrical characteristics of the transistor to develop a control signal which varies in accordance with the substrate temperature. More particularly, transistor 14 is connected as a diode, its base 18 being connected to the common collector defined by the substrate 12, and is employed as the variable element of what may be termed a comparison bridge. The emitter 22 of the transistor 14 is connected to a resistor 26, which is in turn connected to ground, while a pair of serially connected resistors 27 and 28 are connected between the common collector and ground. Thus, transistor 14 and resistor 26 define one branch of the bridge, while resistors 27 and 28 define a second branch of the bridge in parallel with the first. The current flowing through the second branch of the bridge is determined by the bias 23 and the values of the resistances 27 and 28, and this current is substantially constant, as is therefore the voltage drop across resistor 28 which may therefore serve as a reference. The current through the first branch of the bridge, however, varies as a direct function of the junction temperature of the transistor 14 in a well known manner, and inasmuch as this transistor is in good thermal contact with the substrate, the current varies as a direct function of the substrate temperature. The signal developed across resistor 26 thus varies in a direct relation to the substrate temperature. The circuit parameters may be selected such that the signal developed across resistor 26 is equal to that developed across resistor 28 when the substrate is at a desired constant temperature to be maintained. Variations of the signal across the resistor 26 with respect to the reference signal across resistor 28 are then indicative of departures of the substrate temperature from the desired constant value and may be employed to control the current in the heater transistor 13 in a compensatory manner. To this end, a differential amplifier 29 is preferably provided with its inputs respectively connected to the juncture between resistor 26 and the emitter of transistor 14, and to the juncture between resistors 27 and 28. The amplifier characteristics are such that its output voltage varies in a direct relation to the difference between the signals applied to its input and therefore in direct relation to the difference between the substrate temperature and the desired constant temperature to be maintained. The differential amplifier output is connected in series with the resistor 24 associated with the heater transistor 13 to thus control the flow of current therein in an inverse relation to substrate temperature.

In the operation of the foregoing circuit arrangement, it will be appreciated that in response to the substrate temperature being below the desired constant value, the current through the transistor 14 is correspondingly lower than normal, thus decreasing the signal developed across resistor 26 below that of the reference signal developed across resistor 28. The resulting difference between the signals applied to the inputs of the differential amplifier 29 causes the flow of output current therefrom in a positive sense which, in flowing through resistor 24, reverse biases transistor 13 and causes avalanche breakdown. By virtue of the current flow in the emitter-base junction of transistor 13, power is dissipated therefrom in the substrate 12 to thus heat same and cause the substrate temperature to rise. As the temperature continues to rise, the current through transistor 14 proportionately increases as therefore does the signal developed across resistor 26. The difference between the signals applied to the differential amplifier 29 thus progressively decreases to, in turn, decrease the current flowing in the resistor 24 and in the emitter-base junction of the transistor 13. Thus, as a result of the thermal feedback between the transistors 14 and 13, the substrate temperature is continuously regulated to a desired constant value. A constant temperature environment is accordingly established for the transistor 11 herein employed to provide an extremely accurate logarithmic transfer function of an electrical input signal.

Considering now in greater detail the use of the transistor 11 as a logarithmic converter element, it is to be noted that the emitter 19 of this transistor is connected to the common collector defined by the sustrate 12, and therefore the transistor functions as a diode. An input signal source 31 is connected between the base and emitter of transistor 11 to provide a flow of emitter current which is to be converted to a logarithmic output signal derivable from terminals 32 and 33 respectively connected to the emitter and base of the transistor. With such connection of the transistor 11, it is to be noted that the output signal appearing across terminals 32 and 33 is the junction voltage, $V_F$ existing across the common base-collector to emitter junction, while the input signal current from generator 31 is the current $I_F$ through this junction. In accordance with the forward biased characteristics of a PN junction diode, the junction voltage nad junction current are related by the following expression:

$$V_F=V_0+\frac{nkT}{q}\ln\frac{I_F}{I_0}$$

where $k$ is Boltzmann's constant, $q$ is electronic charge, T is absolute temperature in degrees Kelvin, $I_0$ is an arbitrary reference current level, $V_0$ is junction voltage evaluated at $T=T_0$ and $I_F=I_0$, and $n$ is a quantity having a value between one and two which varies as a function of junction current.

With the junction temperature of transistor 11 maintained constant by the constant temperature environment established in accordance with the present invention, the above equation thus reduces to: $V_F=A_1 \ln I_F+A_2$, $A_1$ and $A_2$ being constants in the present case wherein the junction temperature of transistor 11 does not vary. In accordance with the foregoing equation, an extremely accurate logarithmic transfer function of an electrical input signal is thus obtained.

I claim:

1. An arrangement for maintaining a constant temperature environment for semiconductor circuit elements comprising at least one heating semiconductor device for dissipating heat in accordance with the current flowing therethrough, at least one semiconductor circuit element to be maintained at a constant temperature, a substrate common to said heating device and circuit element and in good thermal contact therewith, and temperature sensing transistor having an emitter, a base, a collector, and a base-emitter junction, said transistor in good thermal contact with said substrate for producing a control voltage signal across said base-emitter junction in proportion to the temperature of said substrate, said temperature sensing transistor being coupled to each of said heating semiconductor device to control said current therethrough in accordance with said control voltage signal to maintain a constant temperature in said substrate and therefore in the vicinity of each of said circuit elements.

2. An arrangement according to claim 1, where said substrate is of semiconducting material and said circuit elements, said heating devices, and said temperature sensing transistor respectively are semiconductor devices having said substrate as an integral component thereof.

3. An arrangement according to claim 1, wherein said substrate is a monolithic structure and said circuit elements, said heating devices, and said temperature sensing transistor respectively are semiconductor devices contained in mutually electrically isolated relation in said monolithic structure.

4. An arrangement according to claim 1, wherein said substrate is of insulating ceramic material, and said circuit element, said heating devices, and said temperature sensing transistor respectively are separate semiconductor devices mounted upon said substrate in good thermal contact therewith.

5. An arrangement for establishing a constant temperature environment for semiconductor circuit elements comprising a substrate, at least one semiconductor circuit element in good thermal contact with said substrate, at least one heating semiconductor device in good thermal contact with said substrate in the vicinity of said circuit elements, said heating device dissipating heat in said substrate as a direct function of current flowing through the heating device, a heat-sensing transistor having an emitter-base junction in good thermal contact with said substrate for producing a voltage across said emitter-base junction signal which varies as an inverse function of the temperature of said substrate, and means coupling said heat-sensing transistor to said heating device for controlling the flow of current through the latter as a direct function of said voltage signal to thereby maintain a constant temperature in said substrate and in said circuit elements.

6. An arrangement for establishing a constant temperature environment for semiconductor circuit elements comprising a substrate, a least one semiconductor circuit element in good thermal contact with said substrate, at least one transistor in good thermal contact with said subtrate and dissipating heat therein in a direct relation to the current therethrough, a temperature-sensing transistor in good thermal contact with said substrate and having a current flow across its emitter-base junction in a direct relation to the temperature of said substrate, a comparison bridge including a first branch having a substantially constant current flow therethrough and a second branch including the emitter-base junction of said temperature-sensing transistor in electrical series connection therewith whereby the current flow through said second branch is in a direct relation to the temperature of said substrate, said first and second branches including resistances across which signals are developed in proportion to the currents flowing through said first and second branches, differential means receiving said signals from said first and second branches and generating a signal proportional to the difference between the branch signals, and means coupling said differential means to each of said transistors to control the current therethrough in a direct relation to said difference signal and thereby maintain a constant temperature in said substrate and in the vicinity of each of said semiconductor circuit elements.

7. An arrangement according to claim 6, wherein said substrate is of semiconducting material and forms an integral component of each of said circuit elements, said transistor, and said temperature-sensing transistor.

8. An arrangement according to claim 6, wherein said substrate is a monolithic structure and each of said circuit elements, said transistor, and said temperature-sensing transistor are integrally contained in said monolithic structure in electrically isolated relation to each other.

9. An arrangement according to claim 5, wherein said substrate is of insulating ceramic material, and each of said circuit elements, said transistor, and said temperature-sensing transistor are separate semiconductor devices mounted upon said substrate in good thermal contact therewith.

10. An arrangement for establishing a constant temperature environment for semiconductor circuit elements comprising a semiconductor substrate having at least three diffused junction planar transistors contained therein with the substrate being a common collector of said transistors, the emitter-base junction of one of said transistors serving as a temperature sensor, at least one of said transistors serving as a heater, and the remainder of said transistors serving as circuit elements for connection in an external circuit, the temperature sensor transistor having its base connected to said collector, first and second resistors serially connected between said collector and ground, a third resistor connected between the emitter of said temperature sensor transistor and ground, a differential amplifier having a pair of inputs respectively connected to the juncture between said first and second resistors and to the juncture between said third resistor and the emitter of said temperature sensor transistor, and means connecting the output of said differential amplifier in controlling relation to each of the heater transistors to maintain a current flow therethrough in a direct relation to the amplifier output.

11. An arrangement according to claim 10, further defined by the base of each heater transistor being connected to ground and a resistor connecting the emitter of each heater transistor to the output of said differential amplifier and comprising said means connecting the output of said differential amplifier in controlling relation to each of the heater transistors.

12. A logarithmic converter comprising a substrate, a semiconductor diode in good thermal contact with said substrate, said diode having a junction voltage which varies as a logarithmic function of junction current, means for establishing a current flow through said junction in proportion to an input signal, means for deriving an output signal in proportion to said junction voltage, at least one heating semiconductor device in good thermal contact with said substrate in close proximity to said diode for dissipating heat in the substrate in direct relation to the current through the device, a temperature sensing transistor having an emitter-base junction in good thermal contact with said substrate in close proximity to said diode for generating a current across said emitter-base junction in a direct relation to the temperature of said substrate, and means coupling said temperature-sensing transistor in controlling relation to each of said heating semiconductor devices to vary the current therethrough in direct relation to departure of the current of said temperature sensing transistor below a predetermined reference.

References Cited by the Examiner

UNITED STATES PATENTS

| | | | |
|---|---|---|---|
| 2,932,714 | 4/1960 | Merrill | 219—501 |
| 2,938,130 | 5/1960 | Noll | 219—501 |
| 3,028,473 | 4/1962 | Dyer et al. | 219—501 |
| 3,060,298 | 10/1962 | Swanson | 219—501 |
| 3,079,484 | 2/1963 | Shockley et al. | 219—501 |
| 3,136,877 | 6/1964 | Heller | 219—501 |
| 3,229,071 | 1/1966 | Wisz et al. | 219—501 |

RICHARD M. WOOD, *Primary Examiner.*

L. H. BENDER, *Assistant Examiner.*